(12) United States Patent
Sakamaki (10) Patent No.: US 8,188,770 B2
(45) Date of Patent: May 29, 2012

(54) METHOD AND APPARATUS FOR ADJUSTING DRIVER OUTPUT CURRENT AND ELECTRONIC APPARATUS

(75) Inventor: Hideyuki Sakamaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/926,229

(22) Filed: Nov. 3, 2010

(65) Prior Publication Data

US 2011/0050291 A1 Mar. 3, 2011

Related U.S. Application Data

(63) Continuation of application No. PCT/JP2008/058914, filed on May 15, 2008.

(51) Int. Cl.
*H03K 3/00* (2006.01)
(52) U.S. Cl. ......... 327/108; 327/112; 327/264; 327/272
(58) Field of Classification Search .......... 327/108–112, 327/170, 263–264, 270–272; 326/85, 87
See application file for complete search history.

(56) References Cited

U.S. PATENT DOCUMENTS

| 6,404,258 B2 * | 6/2002 | Ooishi | 327/278 |
| 6,861,918 B2 * | 3/2005 | Tung | 331/185 |
| 7,164,286 B2 | 1/2007 | Yaguchi | |
| 7,218,168 B1 * | 5/2007 | Rahman | 327/540 |
| 2007/0222493 A1 * | 9/2007 | Afentakis et al. | 327/276 |

FOREIGN PATENT DOCUMENTS

| JP | 10-50070 | 2/1998 |
| JP | 2003-204258 | 7/2003 |
| JP | 3520913 | 2/2004 |
| JP | 3547854 | 4/2004 |
| JP | WO2004/114522 | 12/2004 |
| JP | 3704856 | 8/2005 |

OTHER PUBLICATIONS

International Search Report for PCT/JP2008/058914, mailed Jul. 15, 2008.
English Translation of the International Preliminary Report on Patentability mailed Jan. 20, 2011 in corresponding International Patent Application PCT/JP2008/058914.

* cited by examiner

*Primary Examiner* — An Luu
(74) *Attorney, Agent, or Firm* — Staas & Halsey LLP (57) ABSTRACT

According to an aspect of the embodiment, a driver outputs a driver current to a reception LSI, and a receiver included in the reception LSI receives an analog voltage signal corresponding to a value of the driver current as a receiver input. An A/D converter converts the voltage signal of the receiver input to a digital value, and transmits the digital value to a driver current controller in a transmission LSI. The driver current controller adjusts a number of PMOS driving stages in the driver or a number of NMOS driving stages in the driver, to make the digital value of the voltage signal of the receiver input belong to a predetermined range.teh

9 Claims, 11 Drawing Sheets

|  | INPUT | | | OUTPUT | |
| --- | --- | --- | --- | --- | --- |
| ITEM | P[1] | N[1] | DRIVER INPUT | PI | NI |
| 0 | L | L | L | H | L |
| 1 | L | L | H | H | L |
| 2 | L | H | L | H | L |
| 3 | L | H | H | H | H |
| 4 | H | L | L | L | L |
| 5 | H | L | H | H | L |
| 6 | H | H | L | L | L |
| 7 | H | H | H | H | H |

METHOD AND APPARATUS FOR ADJUSTING DRIVER OUTPUT CURRENT AND ELECTRONIC APPARATUS

CROSS-REFERENCE TO RELATED APPLICATIONS

This is a continuation application of PCT application serial number PCT/JP2008/058914, filed on May 15, 2008.

FIELD

The embodiments discussed herein are related to a method and apparatus for adjusting driver output current and an electronic apparatus.

BACKGROUND

With the development of a semiconductor technology and a mounting technology on a chip, an apparatus (for example, an apparatus so-called a blade server) is provided, in which a plurality of CPUs and a main memory having a large capacity are mounted on one board. In such apparatus, because of a problem of the mounting, it is difficult to arrange a plurality of modules (or chips) in a same distance as other modules (or chips). Thus, a time varies when an LSI chip, which is a data request source, receives data from the other LSI chip, which is a data request destination. This time variation mainly depends on characteristics of a board wiring and characteristics of a connector, and performance of the LSI chip. With an improvement of a data processing speed in the recent years, a width of the time variation also becomes unnegligible.

To suppress the EMI (unnecessary Electromagnetic Interference) within the standards, a signal line control method is proposed, which measures a driver output current detected by using a current sensing unit in a driver, and controls the measured output current (for example, refer to Patent Document 1).

However, the control for the driver output current by the above signal line control method is a current control just in the driver. Then, the characteristics of the board wiring, the characteristics of the connector, and the time variation to a reception apparatus are not considered. Thus, the current adjustment cannot make an input level of the receiver become well.

Figure 10:
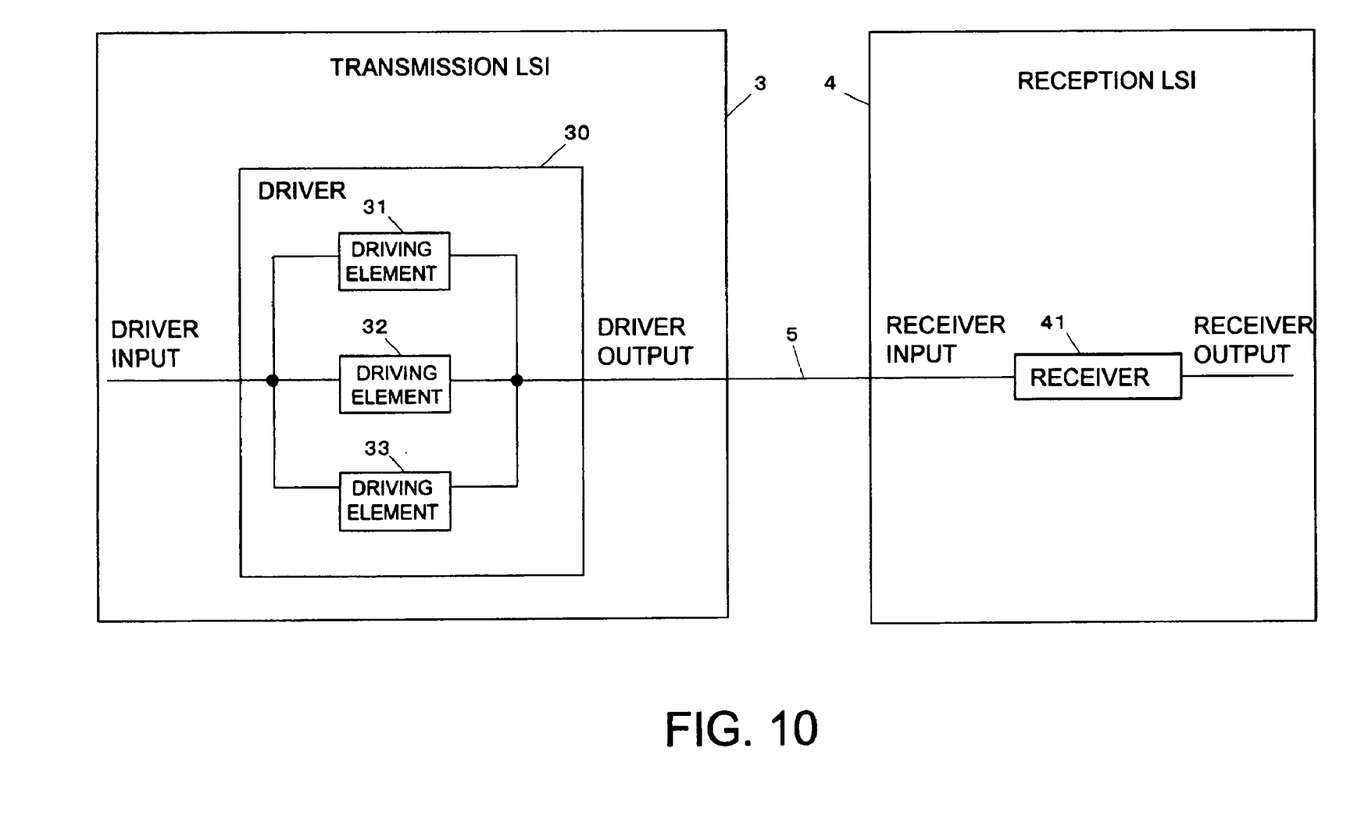
FIG. 10 is a diagram illustrating a conventional exemplary structure when data is transmitted and received between LSIS.
Figure 11:
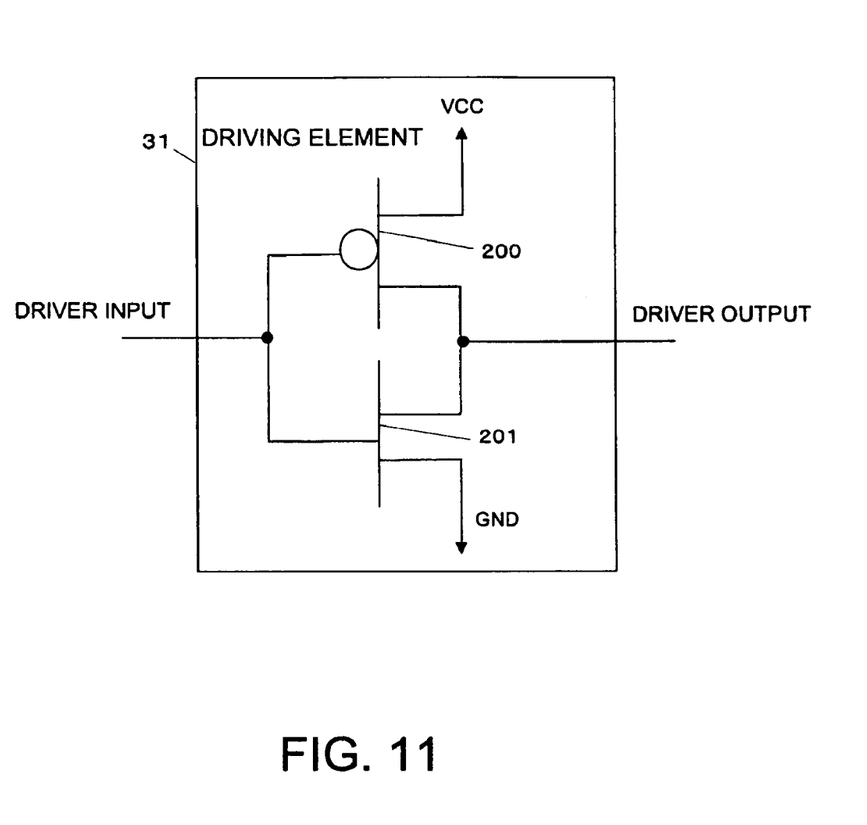
FIG. 11 is a diagram illustrating a structure of the driving element.

For example, data is transmitted from one LSI, which has a driver, to another LSI, which is an external load, as described by referring to FIGS. 10 and 11. In this case, the data transmission is executed in a state that a number of PMOS driving stages is fixed in the driver, and a number of NMOS driving stages is fixed in the driver.

FIG. 10 is a diagram illustrating a conventional exemplary structure when data is transmitted and received between LSIS. A transmission LSI 3 has a driver 30. The transmission LSI 3 is connected to a reception LSI 4 through a board wiring 5 and the like. The driver 30 has a plurality of driving elements (for example, buffers) 31 to 33. As illustrated in FIG. 11, each of driving elements 31 to 33 includes a CMOS circuit, which has a PMOS transistor 200 and an NMOS transistor 201. FIG. 11 illustrates an exemplary structure of the driving element 31 in FIG. 10. Each of driving elements 31 to 33 outputs a current in response to a level of a driver input. In the conventional technology illustrated in FIGS. 10 and 11, the number of the PMOS driving stages is fixed in the driver 30, and the number of the NMOS driving stages is fixed in the driver 30.

When data is transmitted from the transmission LSI 3 to the reception LSI 4, first, a driver input is inputted to the driver 30, which has a plurality of the above driving elements. In response to the driver input, the driver 30 outputs a current. The current outputted from the driver 30 is inputted to a receiver 41, which is a semiconductor circuit included in the reception LSI 4, through the board wiring 5. The receiver 41 outputs a receiver output, so that the reception LSI 4 receives the data.

Patent Document 1: Japanese Patent No. 3520913

In the conventional technology illustrated in FIGS. 10 and 11, the number of the driving stages of PMOS transistors is fixed, and the number of the driving stages of NMOS transistors is fixed. Thus, even when a change of the output current from the driver 30 is increased because of a variation of the current characteristics of each of driving elements 31 to 33, the output current cannot be adjusted. When the output current, whose change is increased, is inputted from the driver 30 to the receiver 41 of the reception LSI 4 through the board wiring 5, a change of voltage amplitude of the data is increased in the receiver 41.

SUMMARY

According to an aspect of the embodiment, a driver output current adjusting method supplies an output current to an external load in response to an input signal. The driver has a plurality of PMOS transistors and a plurality of NMOS transistors. The method includes receiving a signal corresponding to a value of a current outputted from the driver; and adjusting a number of the PMOS driving stages or a number of the NMOS driving stages to make a level of the signal belong to a predetermined range, according to the level of the signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A driver output current adjusting method is disclosed which adjusts an output current of a driver based on a level of a signal outputted from the driver to an external load.

Further, a driver output current adjusting apparatus is disclosed which adjusts an output current of a driver based on a level of a signal outputted from the driver to an external load.

Furthermore, an electronic apparatus is disclosed which has a transmission apparatus transmitting a signal and a reception apparatus receiving the signal. The transmission apparatus independently switches operations of PMOS transistors and NMOS transistors both of which are elements of the driver, in response to a level signal indicating a level of the signal received by the reception apparatus from the transmission apparatus.

In another aspect of the embodiment, a driver output current adjusting apparatus may supply an output current to an external load in response to an input signal. The driver has a plurality of PMOS transistors and a plurality of NMOS transistors. The apparatus includes a reception unit receiving a signal corresponding to a value of a current outputted from the driver; and an adjustment unit adjusting a number of the PMOS driving stages or a number of the NMOS driving stages to make a level of the signal belong to a predetermined range, according to the level of the signal.

In another aspect of the embodiment, an electronic apparatus may include a transmission apparatus transmitting a signal; a reception apparatus receiving the signal through a wiring; a transmission unit provided in the reception apparatus, and transmitting a level signal to the transmission apparatus, the level signal indicating a level of the signal received from the transmission apparatus; a driver provided in the transmission apparatus, and having a plurality of CMOS circuits; and a switching unit provided in the transmission apparatus, and independently switching operation of PMOS transistors which are elements of the driver and operation of NMOS transistors which are elements of the driver, according to the level signal.

According to the driver output current adjusting method and the driver output current adjusting apparatus, it becomes possible to accurately adjust a current outputted from a driver by adjusting the number of the PMOS driving stages in the driver or the number of the NMOS driving stages in the driver, based on a level of the signal corresponding to a value of the current outputted from the driver. According to the electronic apparatus, the transmission apparatus becomes able to independently switch operations of the PMOS transistors in the driver and the NMOS transistors in the driver, according to the level signal indicating a level of the signal received by the reception apparatus from the transmission apparatus.

Preferred embodiments of the present invention will be explained with reference to accompanying drawings.

Figure 1:
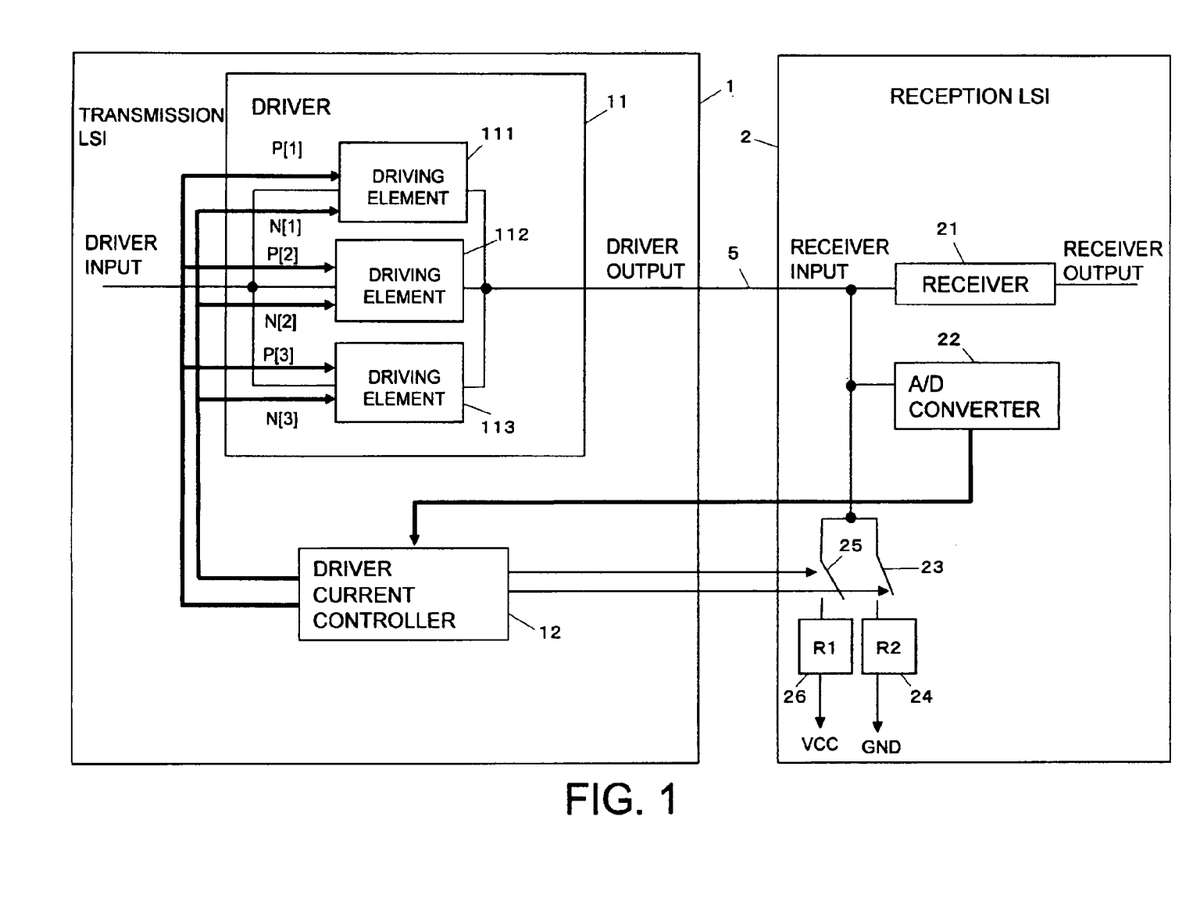
FIG. 1 is a diagram illustrating an example of a structure for implementing a driver output current adjusting method of the embodiment.
Figure 4:
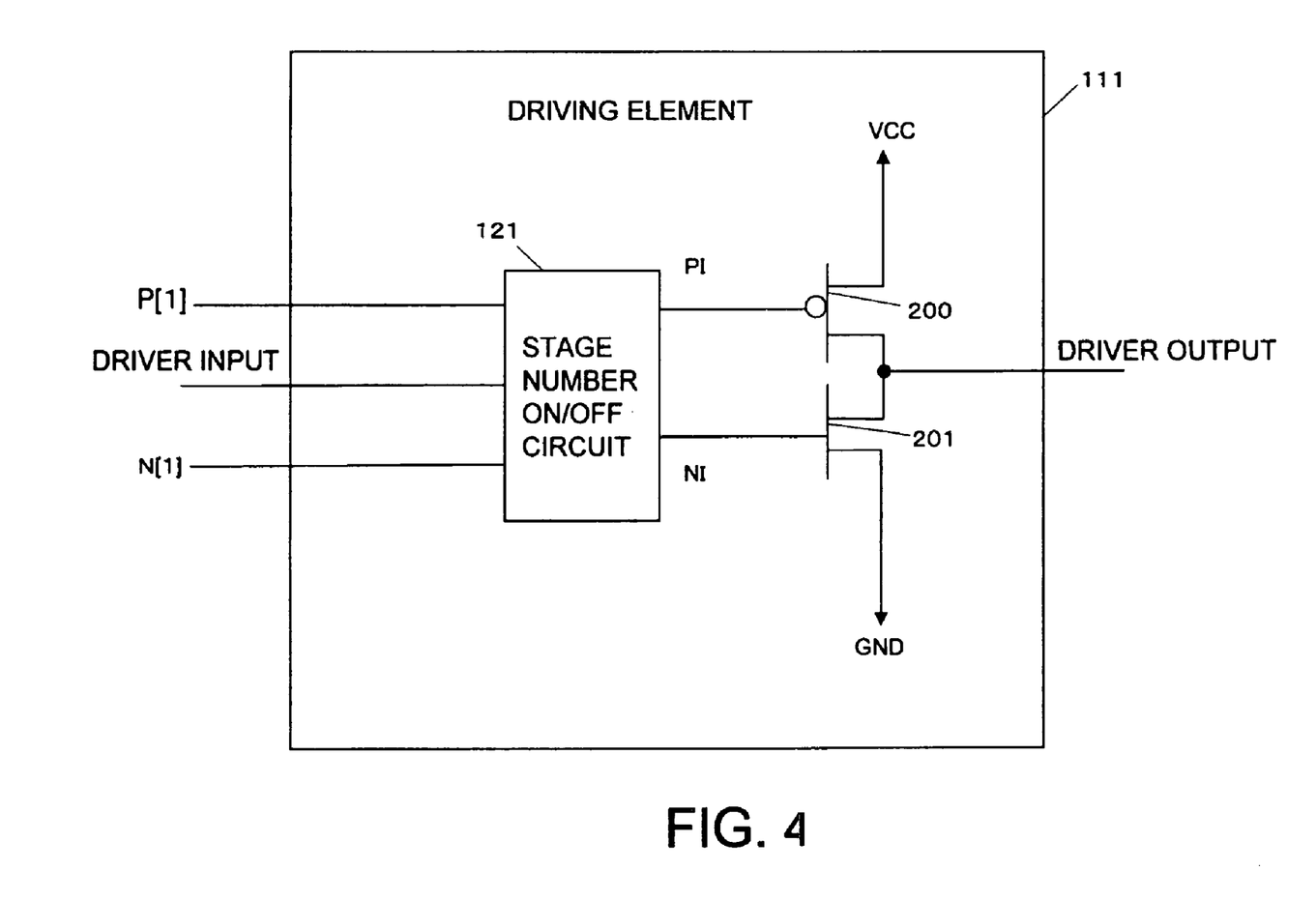
FIG. 4 is a diagram illustrating an example of a structure of a driving element.

FIG. 1 is a diagram illustrating an example of a structure for implementing a driver output current adjusting method of the embodiment. In FIG. 1, a transmission LSI 1, which transmits a signal is connected, through a board wiring 5 to a reception LSI 2, which is an LSI receiving the signal. The transmission LSI 1 has a driver 11 and a driver current controller 12. FIG. 1 illustrates such a structure that the transmission LSI 1 has the driver current controller 12. However, the reception LSI 2 may have the driver current controller 12. The driver 11 supplies an output current (that is, driver output) to the reception LSI 2, which is an external load, in response to an input signal (that is, driver input). The driver 11 has a plurality of stages of driving elements 111 to 113. The driver 11 may have the driving elements with necessary number of stages. Each driving element is a buffer, for example, and includes a CMOS circuit which has a PMOS transistor 200 and an NMOS transistor 201, as illustrated in FIG. 4. Thus, the driver 11 has a plurality of PMOS transistors and a plurality of NMOS transistors. When the signal is inputted as the driver input to each driving element, each driving element outputs the signal as the driver output, based on a PMOS stage number control signal or an NMOS stage number adjusting signal, both of which are received from the driver current controller 12, and a level of the driver input.

The driver current controller 12 receives a digital value, which indicates a voltage of the signal inputted as a receiver input, from an A/D (analog/digital) converter 22 included in the reception LSI 2. And, the driver current controller 12 executes an adjustment for the number of the PMOS driving stages or the adjustment for the number of the NMOS driving stages, both of which are included in the driver 11, to make the digital value belong to a predetermined range in response to the received digital value. The number of the PMOS driving stages is a number of the PMOS transistors which are connected in parallel and are actually driven in the driver 11. And, the number of the NMOS driving stages is a number of the NMOS transistors which are connected in parallel and are actually driven in the driver 11.

When the driver current controller 12 adjusts the number of the PMOS driving stages, the driver current controller 12 compares the digital value of the receiver input received from the A/D converter 22 with a predetermined target value. And, the driver current controller 12 determines the number of the PMOS driving stages to make the received digital value become close to the target value, based on a result of the comparing. The driver current controller 12 transmits the PMOS stage number control signal (P [X]) to the driving element included in the driver 11, and sets the number of the PMOS driving stages to the determined number of the driving stages. The PMOS stage number control signal (P [X]) is a control signal to drive the PMOS transistor included in the X-th stage driving element. The driver current controller 12 inputs the P [X] to the X-th stage driving element. The number of the PMOS driving stages is adjusted in a state that a level of the driver input is set to "L" (Low). The driver current controller 12 adjusts the number of the PMOS driving stages to the determined number of the driving stages, so that the driver 11 outputs a driver current which has a level corresponding to the determined number of the PMOS driving stages. That is, the output current of the driver 11 is adjusted. As a result of the adjusting, the digital value of a voltage signal of the receiver input becomes close to the target value.

The P [1] illustrated in FIG. 1 is a control signal to drive the PMOS transistor included in a driving element 111 of the first stage, in other words, to turn on the PMOS transistor. The P [2] is the control signal to drive the PMOS transistor included in a driving element 112 of the second stage. The P [3] is the control signal to drive the PMOS transistor included in a driving element 113 of the third stage. When the driver current controller 12 sets the P [X] to "H" (High), the PMOS transistor included in the driving element of the X-th stage becomes "ON". And, when the driver current controller 12 sets the P [X] to "L" (Low), the PMOS transistor included in the driving element of the X-th stage becomes "OFF". For example, when the P [1] is "H", the P [2] is "L", and the P [3] is "L", the number of the PMOS driving stages becomes "1", and when the P [1] is "H", the P [2] is "H", and the P [3] is "L", the number of the PMOS driving stages becomes "2".

The driver current controller 12 adjusts the number of the NMOS driving stages, according to the same procedure as the adjustment procedure for the number of the PMOS driving stages. That is, the driver current controller 12 determines the number of the NMOS driving stages to make the digital value of the voltage signal received from the A/D converter 22 become close to the target value. And, the driver current controller 12 transmits the NMOS stage number control signal (N [X]) to the driving element included in the driver 11, and sets the number of the NMOS driving stages to the determined number of the driving stages. The NMOS stage number control signal (N [X]) is a control signal to drive the NMOS transistor included in the X-th stage driving element. The driver current controller 12 inputs the N [X] to the X-th stage driving element. The number of the NMOS driving stages is adjusted in a state that the level of the driver input is set to "H" (High). The driver current controller 12 adjusts the number of the NMOS driving stages to the determined number of the driving stages, so that the driver 11 outputs the driver current which has a level corresponding to the determined number of the NMOS driving stages. That is, the output current of the driver is adjusted. As a result of the adjusting, the digital value of the voltage signal of the receiver input becomes close to the target value.

In other words, the driver current controller 12 selectively outputs, in response to a value of a level signal, the PMOS stage number control signal, and the NMOS stage number control signal. The PMOS stage number control signal is supplied to each PMOS transistor in the driver 11, and independently turns on or off each PMOS transistor. The NMOS stage number control signal is supplied to each NMOS transistor in the driver 11, and turns on or off each NMOS transistor. The level signal is a signal which is transmitted by the A/D converter 22 of the reception LSI 2 to the driver current controller 12. And, the level signal is a signal which indicates a level (a digital value indicating a voltage) of the signal (a signal to be inputted as the receiver input) received by the reception LSI 2 from the transmission LSI 1.

The N [1] illustrated in FIG. 1 is the control signal to drive the NMOS transistor included in the driving element 111 of the first stage. The N [2] is the control signal to drive the NMOS transistor included in the driving element 112 of the second stage. The N [3] is the control signal to drive the NMOS transistor included in the driving element 113 of the third stage. When the driver current controller 12 sets the N [X] to "H" (High), the NMOS transistor included in the driving element of the X-th stage becomes "ON". And, when the driver current controller 12 sets the N [X] to "L" (Low), the NMOS transistor included in the driving element of the X-th stage becomes "OFF". For example, when the N [1] is "H", the N [2] is "L", and the N [3] is "L", the number of the NMOS driving stages becomes "1", and when the N [1] is "H", the N [2] is "H", and the N [3] is "L", the number of the NMOS driving stages becomes "2". The driver current controller 12 independently executes the adjustment for the number of the PMOS driving stages and the adjustment for the number of the NMOS driving stages.

When adjusting the number of the PMOS driving stages, the driver current controller 12 transmits a PMOS transistor side adjusting control signal to the reception LSI 2 to turn on a switch 23. When the switch 23 is turned on, the reception LSI 2 is connected to a pull down resistor 24, which is connected to the ground level. As a result, it becomes possible to adjust the number of the PMOS driving stages, which are actually driven in the driver 11. The PMOS transistor side adjusting control signal is a control signal to switch the switch 23 to "ON" or "OFF". When the PMOS transistor side adjusting control signal is "H" (High), the switch 23 becomes "ON". And, when the PMOS transistor side adjusting control signal is "L" (Low), the switch 23 becomes "OFF".

When adjusting the number of the NMOS driving stages, the driver current controller 12 transmits an NMOS transistor side adjusting control signal to the reception LSI 2 to turn on a switch 25. When the switch 25 is turned on, the reception LSI 2 is connected to a pull up resistor 26, which is connected to a power voltage level. In other words, the switch 25 switches a connection of the pull up resistor 26 to the board wiring 5. As a result, it becomes possible to adjust the number of the NMOS driving stages, which are actually driven in the driver 11. The NMOS transistor side adjusting control signal is a control signal to switch the switch 25 to "ON" or "OFF". When the NMOS transistor side adjusting control signal is "H" (High), the switch 25 becomes "ON". And, when the NMOS transistor side adjusting control signal is "L" (Low), the switch 25 becomes "OFF". In other words, the driver current controller 12 is selective connection unit which selectively connects the reception LSI 2 to the pull up resistor 26 or the pull down resistor 24. The driver current controller 12 may selectively output the NMOS transistor side adjusting control signal to switch "ON" or "OFF" of the switch 25 and the PMOS transistor side adjusting control signal to switch "ON" or "OFF" of the switch 26, to the reception LSI 2, according to the level signal transmitted by the A/D converter 22 to the transmission LSI 1.

A receiver 21 included in the reception LSI 2 is a semiconductor circuit in the reception LSI 2. The receiver 21 receives an analog voltage signal, which corresponds to a value of the driver current outputted from the driver 11 as the receiver input. And, the receiver 21 outputs data which indicates a voltage of the receiver input as a receiver output. The A/D converter 22 converts the analog voltage signal received by the receiver 21, in other words, the voltage signal of the receiver input to a digital value. And, the A/D converter 22 transmits a signal which indicates the digital value to the driver current controller 12 in the transmission LSI 1 as the level signal.

An output current adjusting apparatus for the driver 11 realizes the driver output current adjusting method of the embodiment, and has the receiver 21, the A/D converter 22, the driver current controller 12, the pull down resistor 24, and the pull up resistor 26, each of which is illustrated in FIG. 1. The receiver 21, which is included in the output current adjusting apparatus of the driver 11, receives the voltage signal which corresponds to a value of the current outputted from the driver 11. And, the A/D converter 22 converts the received voltage signal to a digital value. As described above, the driver current controller 12 adjusts the number of the PMOS driving stages in the driver 11 or the number of the NMOS driving stages in the driver 11 to make the digital value belong to a predetermined range, in response to the digital value of the voltage signal.

An electronic apparatus of the embodiment has the transmission LSI 1 which is illustrated in FIG. 1 and functions as a transmission apparatus transmitting a signal, and the reception LSI 2 which functions as a reception apparatus receiving the transmitted signal through the board wiring 5. The A/D converter 22 which is included in the reception LSI 2 is a transmission unit, which transmits the level signal indicating a level of the signal received from the above transmission apparatus to the transmission LSI 1. The driver current controller 12 which is included in the transmission LSI 1 is a switching unit, which independently switches operations of the PMOS transistor in the driver 11 and operations of the NMOS transistor in the driver 11, in response to the transmitted level signal.

Figure 2:
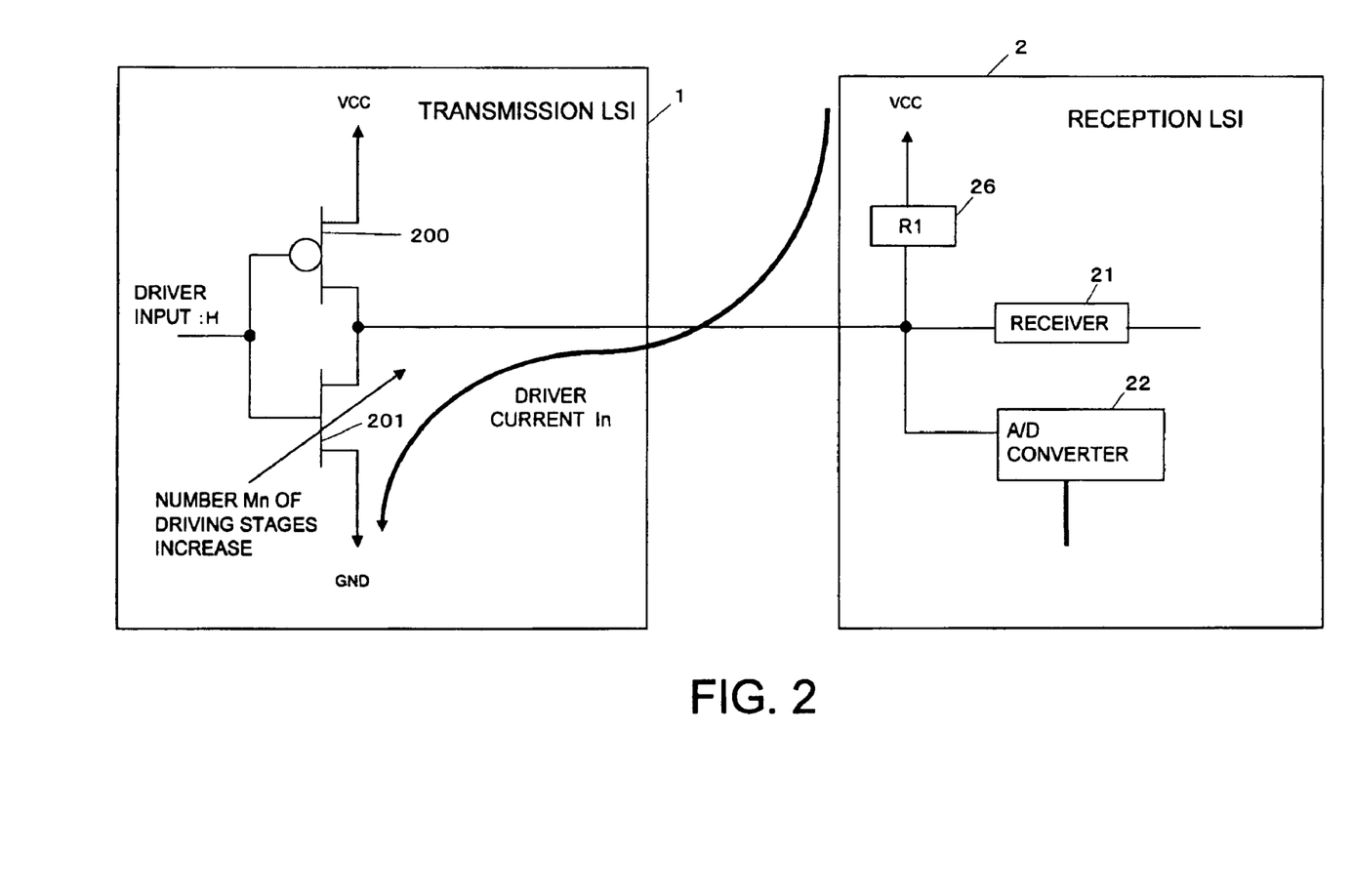
FIG. 2 is a diagram describing a process for determining the number Mn of NMOS driving stages.

FIG. 2 is a diagram describing a process for determining the number Mn of the driving stages of the NMOS transistor.

The adjustment for the number Mn of the driving stages of the NMOS transistor is executed in a state that the NMOS transistor 201 is turned on by "H" (High) of the driver input. Thereby, the output current of the driver, in other words, a driver current In flows through a pull up resistor R1 and an internal resistor "rn" of the NMOS transistor 201 from a power source VCC. An arrow of a heavy line in FIG. 2 indicates a direction in which the driver current In flows. By increasing the number Mn of the driving stages of the NMOS transistor, the internal resistors "rn" of a plurality of the NMOS transistors 201 is increasingly connected in parallel. Then, the driver current In increases, and an analog voltage of the receiver input increases. The A/D converter 22 converts the analog voltage to the digital value, and transmits the digital value to the driver current controller 12 illustrated in FIG. 1. By increasing the number Mn of the driving stages of the NMOS transistor to make the digital value become equal to or less than a target value, the driver current controller 12 adjusts the driver current In.

Figure 3:
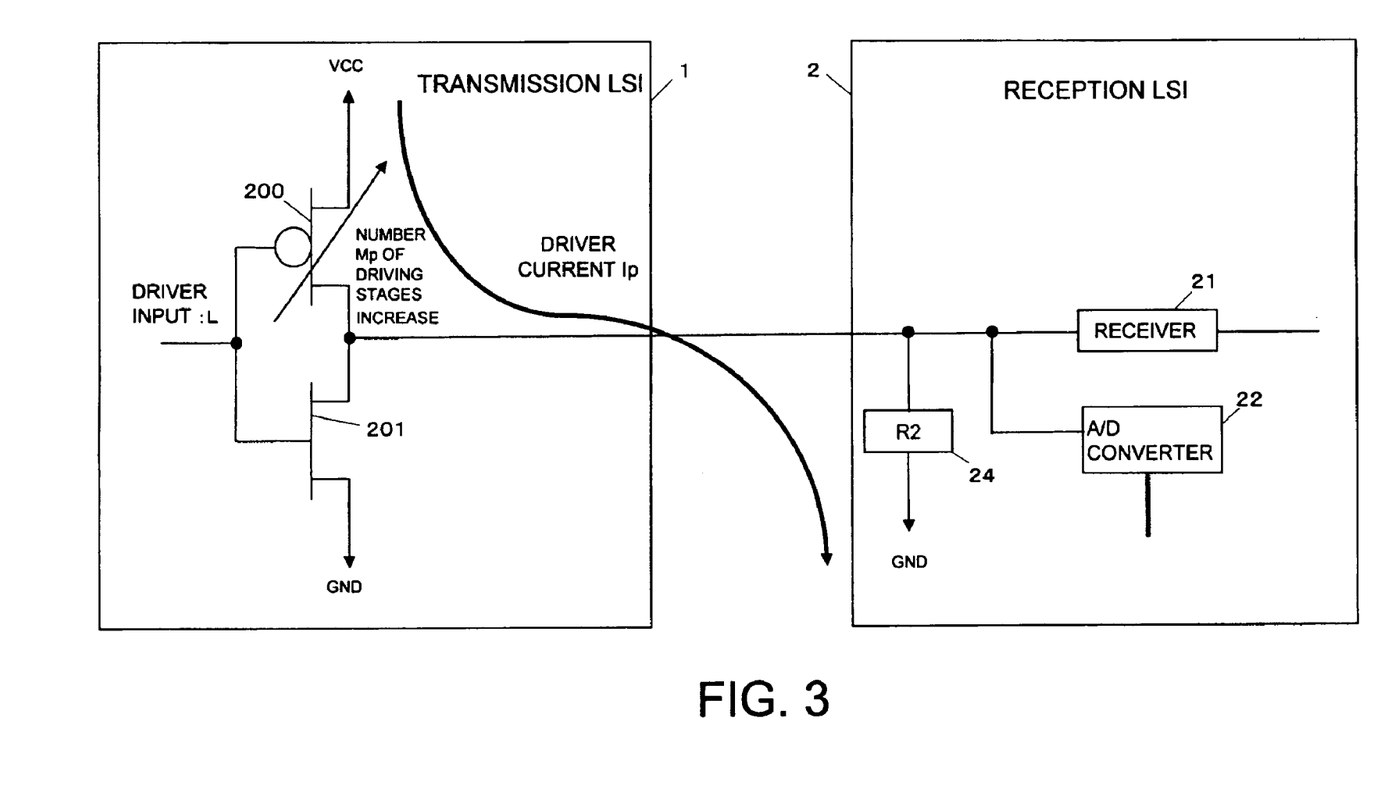
FIG. 3 is a diagram describing a process for determining the number Mp of PMOS driving stages.

FIG. 3 is a diagram describing a process for determining the number Mp of the driving stages of the PMOS transistor. The adjustment for the number Mp of the driving stages of the PMOS transistor is executed in a state that the PMOS transistor 200 is turned on by "L" (Low) of the driver input. Thereby, the output current of the driver, in other words, a driver current Ip flows through an internal resistor "rp" of the PMOS transistor 200 and a pull down resistor R2 from the power source VCC. An arrow of a heavy line in FIG. 3 indicates a direction in which the driver current Ip flows. By increasing the number Mp of the driving stages of the PMOS transistor, the internal resistors "rp" of a plurality of the PMOS transistors 200 is increasingly connected in parallel. Then, the driver current Ip increases, and the analog voltage of the receiver input increases. The A/D converter 22 converts the analog voltage to the digital value, and transmits the digital value to the driver current controller 12 illustrated in FIG. 1. By increasing the number Mp of the driving stages of the PMOS transistor to make the digital value become equal to or more than a target value, the driver current controller 12 adjusts the driver current Ip.

FIG. 4 is a diagram illustrating an example of a structure of the driving element illustrated in FIG. 1. In FIG. 4, a structure of the driving element 111 of one driving stage illustrated in FIG. 1 will be described as an example. The structures of the driving element 112 and the driving element 113 illustrated in FIG. 1 are the same as the structure of the driving element 111 illustrated in FIG. 4.

The driving element 111 has a CMOS circuit which has the PMOS transistor 200 and the NMOS transistor 201, and a stage number ON/OFF circuit 121. The stage number ON/OFF circuit 121 outputs a control signal PI, and turns on or off the PMOS transistor 200 based on the PMOS stage number control signal P [1], which is inputted from the driver current controller 12, and the level of the driver input, both of which are illustrated in FIG. 1. When the control signal PI is "H" (High), the PMOS transistor 200 is turned off. And, when the control signal PI is "L" (Low), the PMOS transistor 200 is turned on. The adjustment for the number of the PMOS driving stages is executed in a state that the level of the driver input is set to "L" (Low). Then, the stage number ON/OFF circuit 121 includes a circuit structure in which, when the driver input is "L", and the P [1] is "H" (High), the PI is "L", in other words, the PMOS transistor 200 is turned on, and the driver current in a state that the PMOS transistor 200 is "ON" is outputted from the driving element 111.

The stage number ON/OFF circuit 121 outputs a control signal NI, and turns on or off the NMOS transistor 201 based on the NMOS stage number control signal N [1], which is inputted from the driver current controller 12, and the level of the driver input. When the control signal NI is "H" (High), the NMOS transistor is turned on. And, when the control signal NI is "L" (Low), the NMOS transistor is turned off. The adjustment for the number of the NMOS driving stages is executed in a state that the level of the driver input is set to "H" (High). Then, the stage number ON/OFF circuit 121 includes a circuit structure in which, when the driver input is "H", and the N [1] is "H" (High), the NI is "H", in other words, the NMOS transistor 201 is turned on, and the driver current in a state that the NMOS transistor 201 is "ON" is outputted from the driving element 111.

Figure 5:
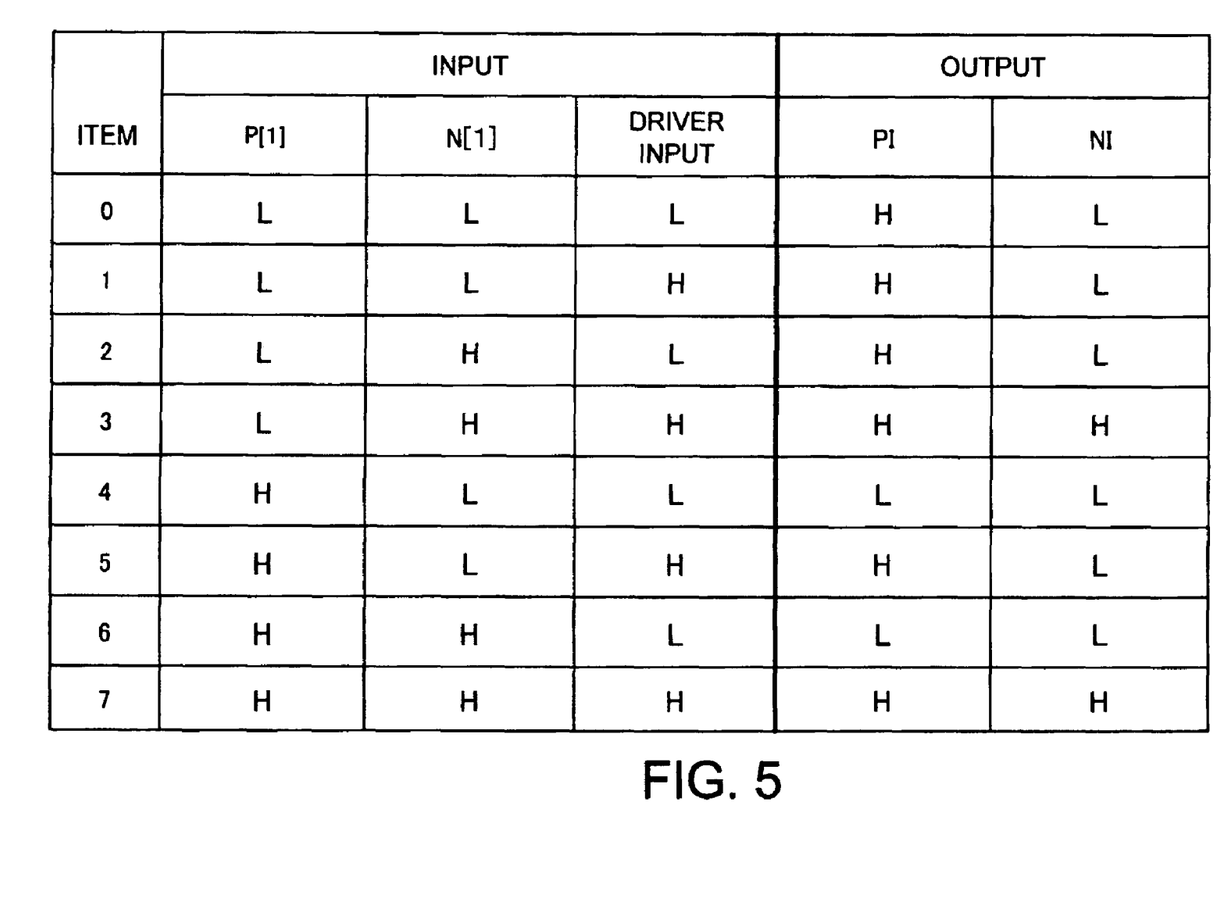
FIG. 5 is an example of a truth table which is complied with by a stage number ON/OFF circuit.

For example, the stage number ON/OFF circuit 121 has a circuit structure according to a truth table indicated in FIG. 5. An item 0 of the truth table indicated in FIG. 5 illustrates that, when the P [1] is "L", N [1] is "L" and the driver input is "L", all of which are inputted to the stage number ON/OFF circuit 121, the PI becomes "H" (the PMOS transistor is "OFF"), and the NI becomes "L" (the NMOS transistor is "OFF"). For example, an item 4 of the truth table indicated in FIG. 5 illustrates that, when the P [1] is "H", N [1] is "L" and the driver input is "L", all of which are inputted to the stage number ON/OFF circuit 121, the PI becomes "L" (the PMOS transistor is "ON"), and the NI becomes "L" (the NMOS transistor is "OFF"). Since the PMOS transistor is turned on in the item 4 of the truth table, when the driver input is "L", the driver output becomes "H" (High). The stage number ON/OFF circuit included in the driving element 112, and the stage number ON/OFF circuit included in the driving element 113, both of which are illustrated in FIG. 1, include the circuit structures according to the same truth table as the truth table indicated in FIG. 5, respectively.

Figure 6:
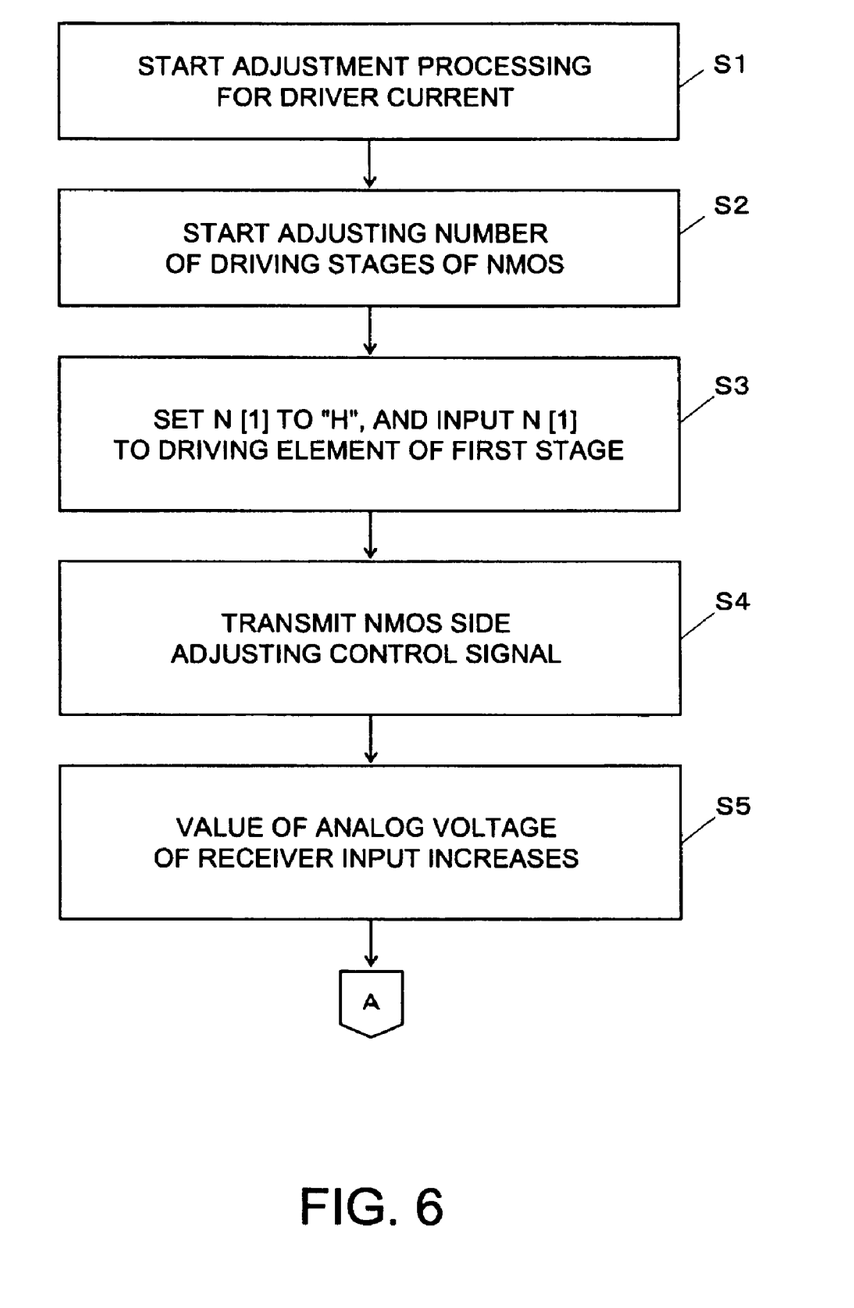
FIG. 6 is a diagram illustrating an example of an adjustment processing flowchart of an output current of a driver.
Figure 7:
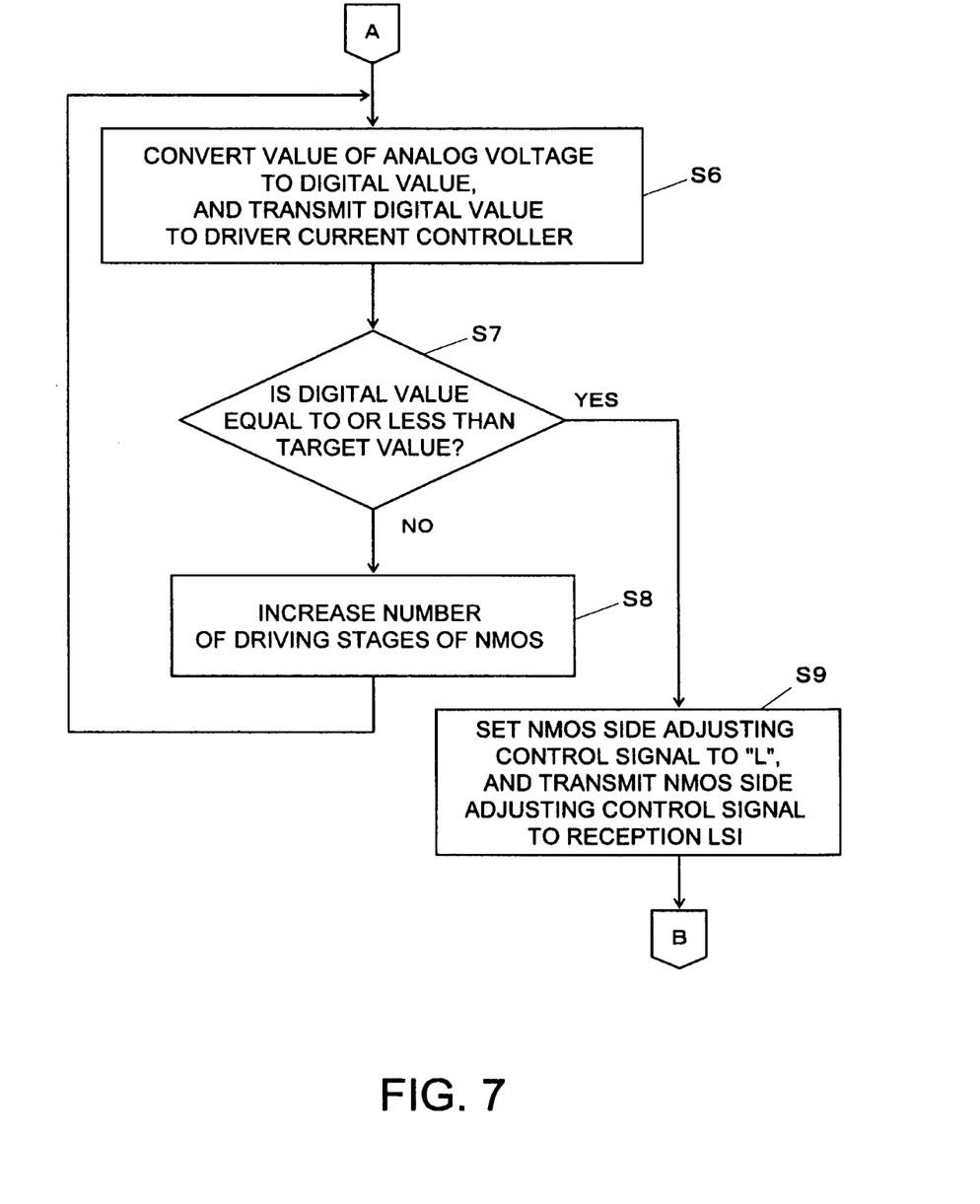
FIG. 7 is a diagram illustrating an example of the adjustment processing flowchart of the output current of the driver.
Figure 8:
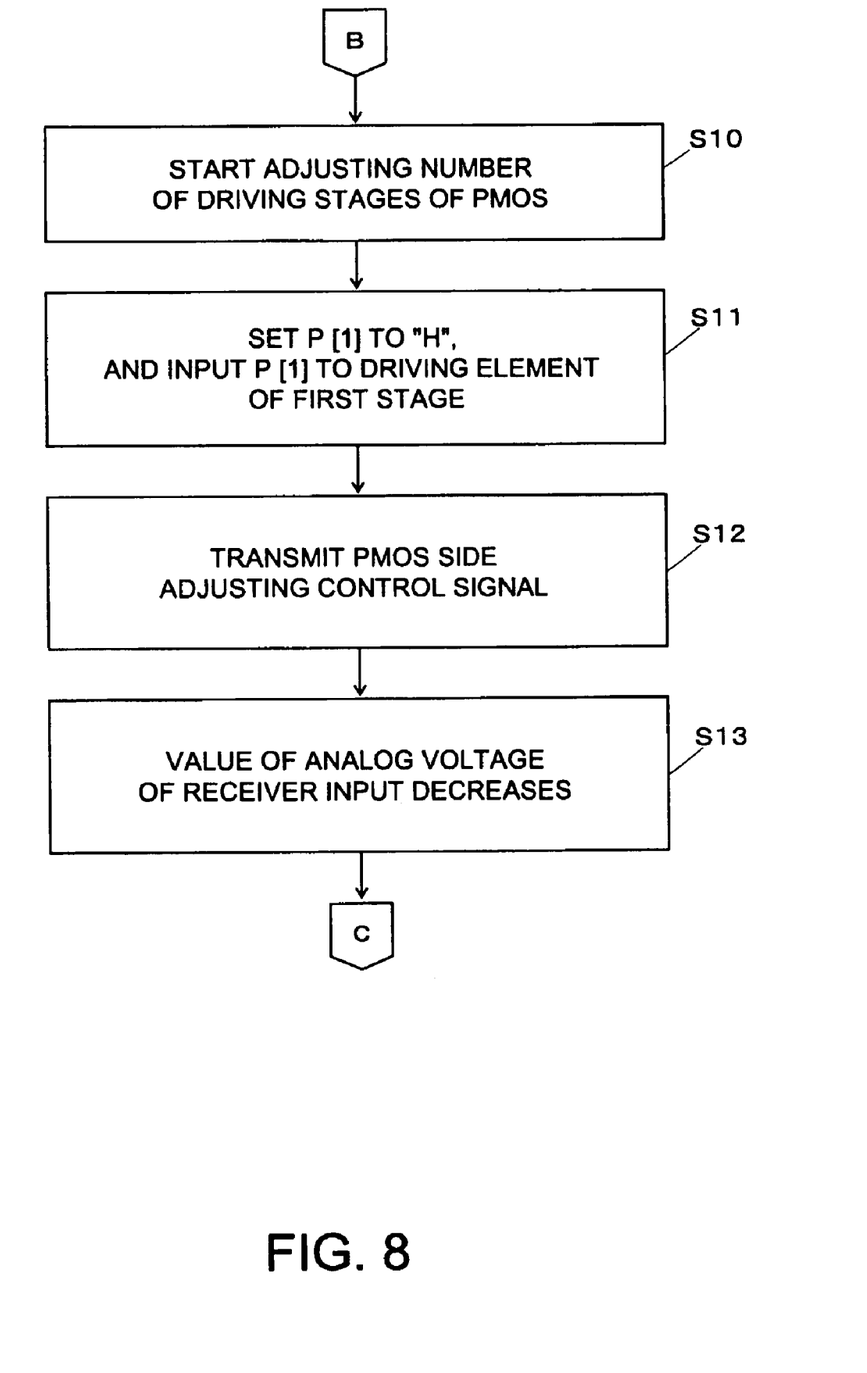
FIG. 8 is a diagram illustrating an example of the adjustment processing flowchart of the output current of the driver.
Figure 9:
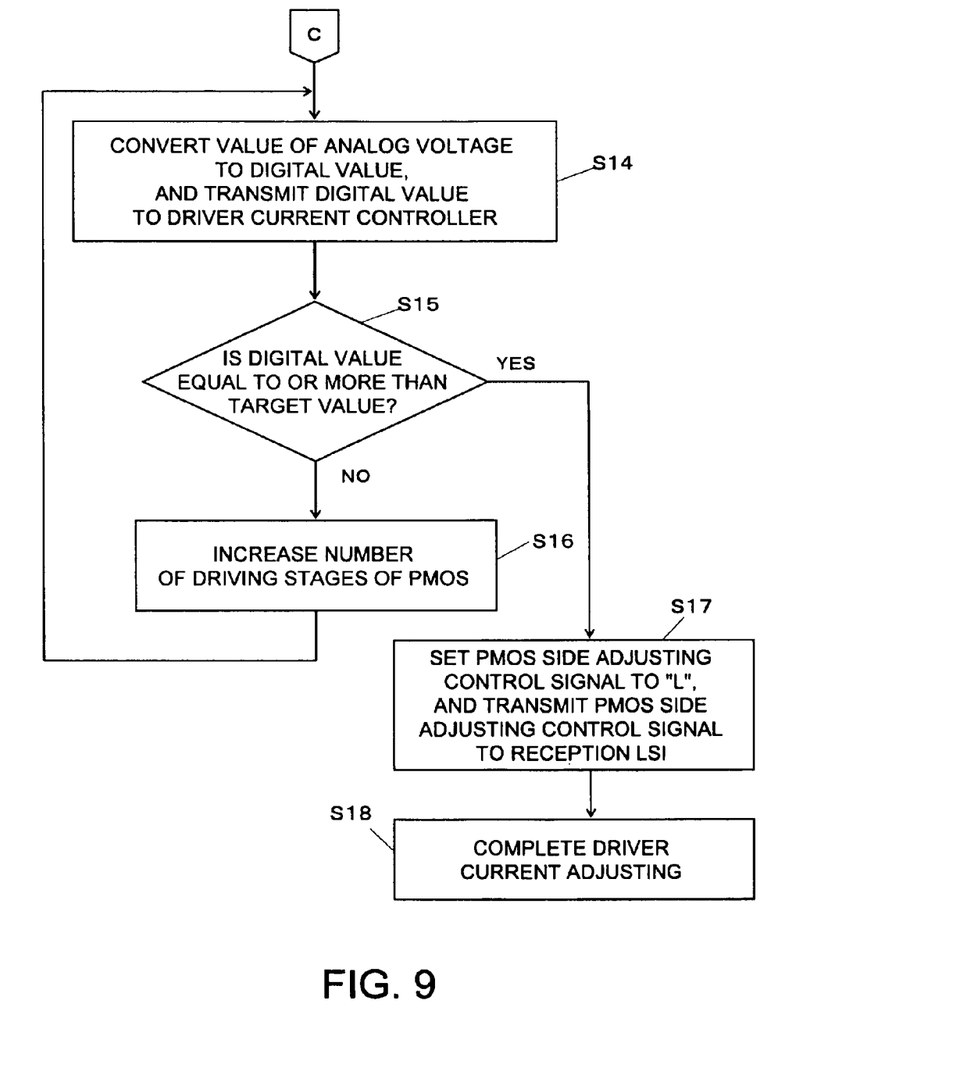
FIG. 9 is a diagram illustrating an example of the adjustment processing flowchart of the output current of the driver.

FIGS. 6 to 9 are diagrams illustrating an example of an adjustment processing flowchart of the driver current according to the driver output current adjusting method of the embodiment. After the reception LSI 2 and the transmission LSI 1 are powered on, both of which are illustrated in FIG. 1, and before the reception LSI 2 transmits data to the transmission LSI 1, the driver output current adjusting apparatus of the embodiment executes the adjustment for the number of the NMOS driving stages and the adjustment for the number of the PMOS driving stages. S2 to S5 of FIG. 6, and S6 to S9 of FIG. 7 illustrate the adjustment processing for the number of the NMOS driving stages. S10 to S13 of FIG. 8, and S14 to S17 of FIG. 9 illustrate the adjustment processing for the number of the PMOS driving stages.

At S1 of FIG. 6, the adjustment processing for the driver current is started, and then the driver current controller 12 starts adjusting the number of the NMOS driving stages (S2). In a state that the driver input is "H", the driver current controller 12 sets the NMOS stage number control signal N [1] to "H", inputs the N [1] to the driving element 111, which is the driving element of the first stage, and turns on the NMOS transistor 201 included in the driving element 111 (S3). At S3, the driver current controller 12 further sets the N [2] to "L", and the N [3] to "L". The N [2] is to be inputted to the driving element 112, which is the driving element of the second stage, and the N [3] is to be inputted to the driving element 113, which is the driving element of the third stage. By the process of S3, the driver output becomes "L".

Next, the driver current controller 12 sets the NMOS transistor side adjusting control signal to "H", transmits the NMOS transistor side adjusting control signal to the reception LSI 2, and turns on the switch 25 (S4). By the process of S4, the reception LSI 2 is connected to the pull up resistor 26. By turning on the switch 25 and connecting the reception LSI 2 to the pull up resistor 26, a value of the analog voltage of the receiver input increases (S5), and the processing proceeds to S6 of FIG. 7.

At S6 of FIG. 7, the A/D converter 22 converts the value of the analog voltage of the receiver input to a digital value, and transmits the digital value to the driver current controller 12. The driver current controller 12 receives the digital value of the voltage from the A/D converter 22, and determines whether the digital value of the voltage is equal to or less than a predetermined target value (S7). When the driver current controller 12 determines that the digital value of the voltage is not equal to or less than the predetermined target value, the driver current controller 12 increases the number of the NMOS driving stages (S8), and the processing returns to S6. At S8, for example, the driver current controller 12 sets the NMOS stage number control signal N [2] to "H", and inputs the N [2] to the driving element of the second stage, so that the driver current controller 12 increases the number of the NMOS driving stages to "2". Since the driver current controller 12 increases the number of the NMOS driving stages, the driver current increases, and the analog voltage of the receiver input decreases.

At S7, when the driver current controller 12 determines that the digital value of the voltage is equal to or less than the predetermined target value, the driver current controller 12 sets the NMOS transistor side adjusting control signal to "L", transmits the NMOS transistor side adjusting control signal to the reception LSI 2, and turns off the switch 25 (S9). By the processing at S9, the adjustment processing for the number of the NMOS driving stages is completed, and the processing proceeds to S10 of FIG. 8.

At S10 of FIG. 8, the driver current controller 12 starts adjusting the number of the PMOS driving stages. In a state that the driver input is "L", the driver current controller 12 sets the PMOS stage number control signal P [1] to "H", inputs the P [1] to the driving element 111, which is the driving element of the first stage, and turns on the PMOS transistor 200 included in the driving element 111 (S11). At S11, the driver current controller 12 further sets the P [2] to "L", and the P [3] to "L". The P [2] is to be inputted to the driving element 112, which is the driving element of the second stage, and the P [3] is to be inputted to the driving element 113, which is the driving element of the third stage. By the processing at S11, the driver output becomes "H".

Next, the driver current controller 12 sets the PMOS transistor side adjusting control signal to "H", transmits the PMOS transistor side adjusting control signal to the reception LSI 2, and turns on the switch 23 (S12). By the processing at S12, the reception LSI 2 is connected to the pull down resistor 24. As a result, the value of the analog voltage of the receiver input decreases (S13), and the processing proceeds to S14 of FIG. 9.

At S14 of FIG. 9, the A/D converter 22 converts the value of the analog voltage of the receiver input to the digital value, and transmits the digital value to the driver current controller 12 (S14). The driver current controller 12 receives the digital value of the voltage from the A/D converter 22, and determines whether the digital value of the voltage is equal to or more than a predetermined target value (S15). When the driver current controller 12 determines that the digital value of the voltage is not equal to or more than the predetermined target value, the driver current controller 12 increases the number of the PMOS driving stages (S16), and the processing returns to S14. At S16, for example, the driver current controller 12 sets the PMOS stage number control signal P [2] to "H", and inputs the P [2] to the driving element of the second stage, so that the driver current controller 12 increases the number of the PMOS driving stages to "2". Since the driver current controller 12 increases the number of the PMOS driving stages, the driver current increases, and the analog voltage of the receiver input increases.

At S15, when the driver current controller 12 determines that the digital value of the voltage is equal to or more than the predetermined target value, the driver current controller 12 sets the PMOS transistor side adjusting control signal to "L", transmits the PMOS transistor side adjusting control signal to the reception LSI 2, and turns off the switch 23 (S17). The adjustment processing for the driver current is completed (S18).

In the adjustment processing for the driver current, which is described by referring to the above FIGS. 6 to 9, the adjustment for the number of the PMOS driving stages, and the adjustment for the number of the NMOS driving stages are independently executed. Thus, by adjusting the number of the PMOS driving stages, for example, it is possible to adjust the value of the driver current to make the voltage of the receiver input corresponding to the driver current become equal to or more than the target value. By adjusting the number of the NMOS driving stages, for example, it is possible to adjust the value of the driver current to make the voltage of the receiver input corresponding to the driver current become equal to or less than the target value.

According to the driver output current adjusting method and the driver output current adjusting apparatus of the embodiment, it becomes possible to accurately adjust the current outputted from the driver by adjusting the number of the PMOS driving stages or the number of the NMOS driving stages, both of which are included in the driver, based on the level of the signal corresponding to the value of the current outputted from the driver. According to the electronic apparatus of the embodiment, it becomes possible for the transmission apparatus to independently switch operations of the PMOS transistor and operations of the NMOS transistor, both of which are the elements of the driver, according to the level signal which indicates the level of the signal received by the reception apparatus from the transmission apparatus.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the sprit and scope of the invention.

What is claimed is:

1. A driver output current adjusting method for supplying an output current to an external load in response to an input signal, the driver having a plurality of PMOS transistors and a plurality of NMOS transistors, the method comprising:
receiving a signal corresponding to a value of a current outputted from the driver; and
adjusting a number of the PMOS driving stages or a number of the NMOS driving stages to make a level of the signal belong to a predetermined range, according to the level of the signal.

2. The driver output current adjusting method according to claim 1, wherein the number of the PMOS driving stages and the number of the NMOS driving stages are adjusted independently.

3. The driver output current adjusting method according to claim 1, wherein the number of the NMOS driving stages is adjusted in a state that the external load is connected to a pull up resistor, and the number of the PMOS driving stages is adjusted in a state that the external load is connected to a pull down resistor.

4. A driver output current adjusting apparatus for supplying an output current to an external load in response to an input signal, the driver having a plurality of PMOS transistors and a plurality of NMOS transistors, the apparatus comprising:
  a reception unit receiving a signal corresponding to a value of a current outputted from the driver; and
  an adjustment unit adjusting a number of the PMOS driving stages or a number of the NMOS driving stages to make a level of the signal belong to a predetermined range, according to the level of the signal.

5. The driver output current adjusting apparatus according to claim 4, wherein the adjustment unit independently adjusts the number of the PMOS driving stages and the number of the NMOS driving stages.

6. The driver output current adjusting apparatus according to claim 4, further comprising:
  a connection unit selectively connecting a pull up resistor or a pull down resistor to the external load,
  wherein the adjustment unit adjusts the number of the NMOS driving stages in a state that the external load is connected to the pull up resistor by the selective connection unit, and adjusts the number of the PMOS driving stages in a state that the external load is connected to the pull down resistor by the selective connection unit.

7. An electronic apparatus, comprising:
  a transmission apparatus transmitting a signal;
  a reception apparatus receiving the signal through a wiring;
  a transmission unit provided in the reception apparatus, and transmitting a level signal to the transmission apparatus, the level signal indicating a level of the signal received from the transmission apparatus;
  a driver provided in the transmission apparatus, and having a plurality of CMOS circuits; and
  a switching unit provided in the transmission apparatus, and independently switching operation of PMOS transistors which are elements of the driver and operation of NMOS transistors which are elements of the driver, according to the level signal.

8. The electronic apparatus according to claim 7, wherein the switching unit selectively outputs a first driving signal and a second driving signal in response to a value of the level signal, the first driving signal is supplied to the PMOS transistors in the driver and independently turns on or off each PMOS transistor, and a second driving signal is supplied to the NMOS transistors in the driver and turns on or off each NMOS transistor.

9. The electronic apparatus according to claim 7,
  wherein the reception apparatus further comprises a pull up resistor connected to a power voltage level, a pull down resistor connected to a ground level, a first switch switching a connection to the wiring of the pull up resistor, and a second switch switching a connection to the wiring of the pull down resistor, and
  wherein the switching unit selectively outputs a first control signal switching on or off the first switch, and a second control signal switching on or off the second switch to the reception apparatus, according to the level signal.

* * * * *

UNITED STATES PATENT AND TRADEMARK OFFICE
CERTIFICATE OF CORRECTION

| | |
|---|---|
| PATENT NO. | : 8,188,770 B2 |
| APPLICATION NO. | : 12/926229 |
| DATED | : May 29, 2012 |
| INVENTOR(S) | : Hideyuki Sakamaki |

It is certified that error appears in the above-identified patent and that said Letters Patent is hereby corrected as shown below:

Title page Column 2 (Abstract), Line 11, Delete "range.teh" and insert -- range. --, therefor.

Signed and Sealed this
Twenty-eighth Day of August, 2012

David J. Kappos
*Director of the United States Patent and Trademark Office*